United States Patent
Borowski et al.

(10) Patent No.: US 7,959,419 B2
(45) Date of Patent: Jun. 14, 2011

(54) REMOVABLE FAN FOR ELECTRONIC DEVICES

(75) Inventors: Olaf Borowski, Rocklin, CA (US); Denis J. Crovo, Citrus Hights, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 429 days.

(21) Appl. No.: 11/143,356

(22) Filed: Jun. 1, 2005

(65) Prior Publication Data

US 2006/0275152 A1 Dec. 7, 2006

(51) Int. Cl.
*F04B 35/04* (2006.01)
*H05K 7/20* (2006.01)

(52) U.S. Cl. ............. 417/423.15; 361/695; 454/184; 215/222

(58) Field of Classification Search ............ 417/423.15; 439/311, 671; 361/695; 454/184; 215/222, 215/332

See application file for complete search history.

(56) References Cited

U.S. PATENT DOCUMENTS

| | | | | |
|---|---|---|---|---|
| 1,590,018 A * | 6/1926 | Godley | ............ | 439/336 |
| 3,749,270 A * | 7/1973 | Affleck | ............ | 215/222 |
| 4,515,538 A * | 5/1985 | Shih | ............ | 417/572 |
| 5,015,195 A * | 5/1991 | Piriz | ............ | 439/318 |
| 5,154,628 A * | 10/1992 | Skegin | ............ | 439/336 |
| 5,710,541 A * | 1/1998 | Stanley et al. | ............ | 340/628 |
| 5,788,566 A * | 8/1998 | McAnally et al. | ............ | 454/184 |
| 6,146,191 A * | 11/2000 | Kerr et al. | ............ | 439/537 |
| 6,330,156 B1 | 12/2001 | Cresse | | |
| 6,343,012 B1 * | 1/2002 | Rife | ............ | 361/695 |
| 6,373,698 B1 * | 4/2002 | Christensen | ............ | 361/695 |
| 6,433,700 B1 * | 8/2002 | Malewski et al. | ............ | 340/693.11 |
| 6,540,804 B1 * | 4/2003 | Wennerstrom | ............ | 55/472 |
| 6,616,525 B1 | 9/2003 | Giraldo et al. | | |
| 6,722,971 B2 * | 4/2004 | Gough | ............ | 454/187 |
| 6,793,469 B2 * | 9/2004 | Chung | ............ | 417/411 |
| 6,836,917 B2 * | 1/2005 | Blaustein et al. | ............ | 15/22.1 |
| 2003/0145483 A1 * | 8/2003 | Buhler et al. | ............ | 34/437 |
| 2004/0083526 A1 * | 5/2004 | Ichigaya | ............ | 2/2.14 |

FOREIGN PATENT DOCUMENTS

EP 0242342 A 10/1987

* cited by examiner

*Primary Examiner* — Devon C. Kramer
*Assistant Examiner* — Patrick Hamo

(57) ABSTRACT

A cooling system for an electric device such as a personal computer is disclosed. The cooling system includes a receiving assembly and a removable fan assembly. The receiving assembly has a first component of a bayonet lock and first electrical contact, while the fan assembly has a fan blade, a motor for the fan blade, a second component of the bayonet lock, and a second electrical contact. The first and second electrical contacts are situated with radial respect to each other such that turning the fan assembly to engage the bayonet lock forces an electrical connection between the first and second electrical contacts.

18 Claims, 12 Drawing Sheets

REMOVABLE FAN FOR ELECTRONIC DEVICES

FIELD OF THE INVENTION

Embodiments of the present invention relate to cooling removable systems for electronic devices.

BACKGROUND OF THE INVENTION

During normal operation of many electric devices, excess heat is generated. Fans are ideal for dispersing this excess heat. After extended operation of an electric device, it is common for a fan to burn out, the bearings fail or in summary the fan stops working. If the fan stops working, a user must replace the fan, or perhaps replace the device altogether. For example, if a fan on a personal computer burns out, the user is likely to have the fan replaced or repaired. If a fan on a device such as a hairdryer burns out, a user is likely to discard the entire hairdryer and purchase a new one.

In the example of the personal computer (PC), the fan replacement or fan repair is performed by a technician. Currently, PCs are not manufactured to encourage or allow user access to the fan or fans. Fan replacement or fan repair is generally a task left to trained individuals, and not the average user. Sending a PC to a technician for repair, or having a technician come to the site of the PC, is costly, both financially and in terms of downtime for the PC while the user is waiting for the scheduled repair. In the example of the hairdryer, the entire device is typically sacrificed when one component, e.g. the fan, stops working. In any case, the device typically has to be powered off (power removed) to service the device. Thus, what is desired is a mechanism which facilitates the easy removal of a broken fan and ready insertion of a replacement fan.

SUMMARY OF THE INVENTION

A cooling system for an electric device is disclosed, including a receiving assembly and a removable fan assembly. The receiving assembly has a first component of a bayonet lock and a first electrical contact, and the removable fan assembly has a fan blade, a motor for the fan blade, a second component of the bayonet lock, and a second electrical contact. The first and second electrical contacts are situated with radial respect to each other such that engaging the bayonet lock forces an electrical connection between the first and second electrical contact.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to various embodiments of the invention, examples of which are illustrated in the accompanying drawings. While the invention will be described in conjunction with various embodiments, it will be understood that they are not intended to limit the invention to these embodiments. On the contrary, the invention is intended to cover alternatives, modifications and equivalents, which may be included within the spirit and the scope of the invention as defined by the appended claims. Furthermore, in the following detailed description of the present invention, numerous specific details are set forth in order to provide a thorough understanding of the present invention. However, it will be apparent to one skilled in the art that the present invention may be practiced without these specific details. In other instances, well-known methods, procedures, components, structures and devices have not been described in detail so as to avoid unnecessarily obscuring aspects of the present invention.

Figure 1A:
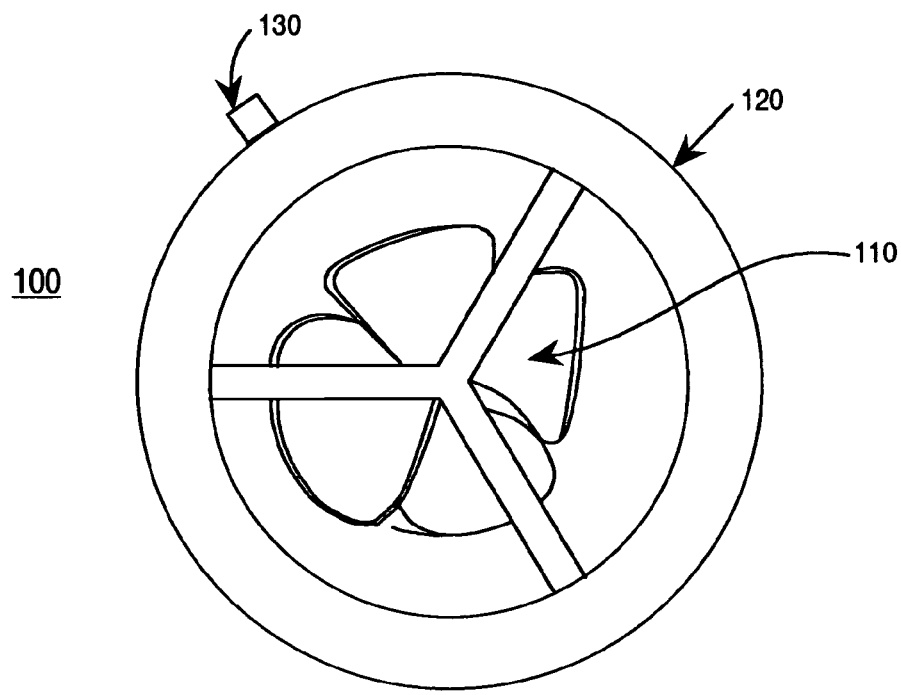
FIG. 1A is a front side view of a removable fan assembly for an electric device.
Figure 1B:
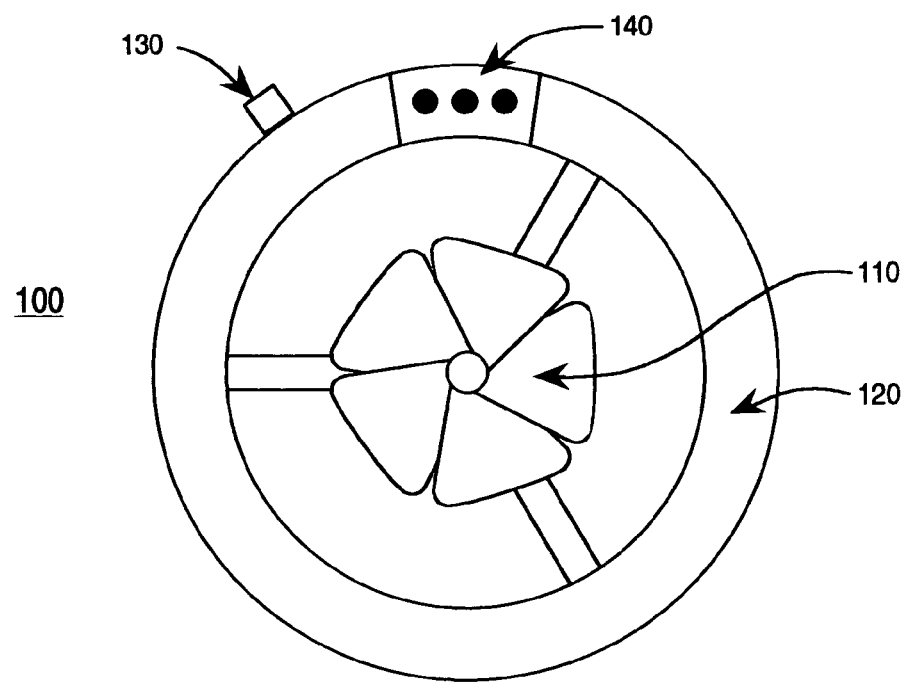
FIG. 1B is a back side view of a removable fan assembly for an electric device.
Figure 1C:
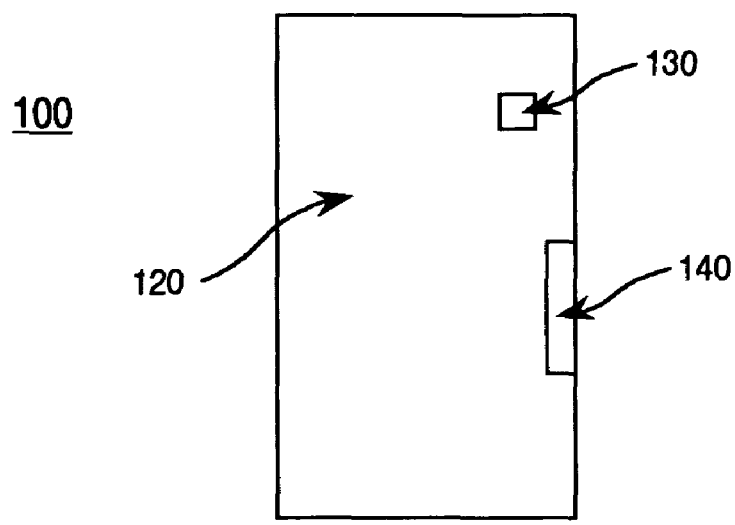
FIG. 1C is a side view of a removable fan assembly for an electric device.

One embodiment of the present invention is a cooling system for an electric device, such as a personal computer, that has a user-removable fan assembly. FIG. 1A illustrates a front view of a removable fan assembly 100 in accordance with an embodiment of the present invention. A cylindrical frame 120 contains a fan blade 110 for providing airflow to an electric device, e.g. a personal computer. Located on the outer surface of the cylindrical frame 120 is a key 130 for a bayonet-style lock. FIG. 1B illustrates a back view of the fan assembly 100. In this depiction, the back of the fan assembly 100 is the end of the fan assembly 100 which enters a receiving assembly first. FIG. 1B depicts an electrical contact 140 positioned on the cylindrical frame 120 to facilitate an electrical connection with a receiving assembly, in order to provide electric power to operate the fan motor which in turn spins the fan blade 110. FIG. 1C illustrates a side view of a fan assembly in accordance with an embodiment of the present invention. FIG. 1C illustrates the bayonet key 130 and the electrical contact 140, as depicted in FIGS. 1A and 1B.

Figure 1D:
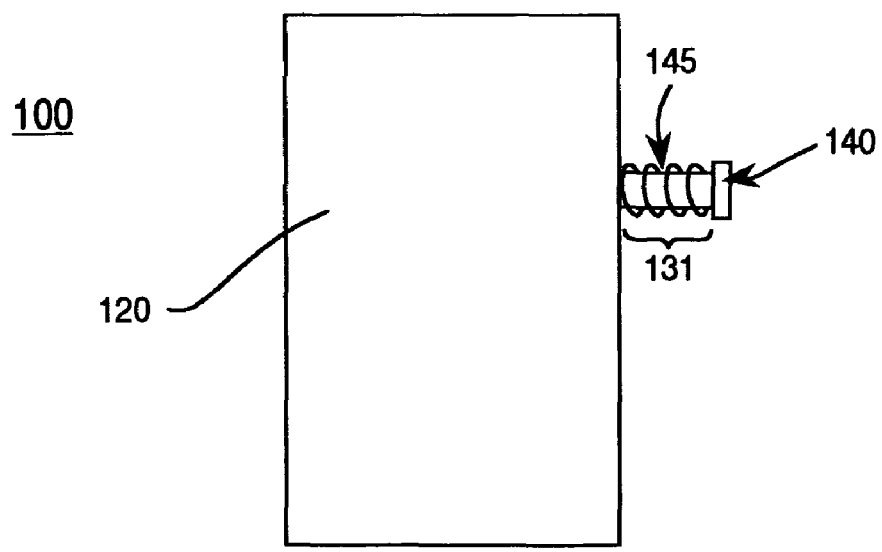
FIG. 1D is a side view of a removable fan assembly according to an alternative embodiment of the present invention.

In a preferred embodiment, the electrical contact 140 is spring loaded to push the inserted fan assembly back in the opposite direction. This will ensure a proper lock of the bayonet. FIG. 1D depicts this embodiment of the present invention, wherein a spring 145 provides spring loaded action to force the inserted fan assembly 100 back to lock it into place.

Figure 2:
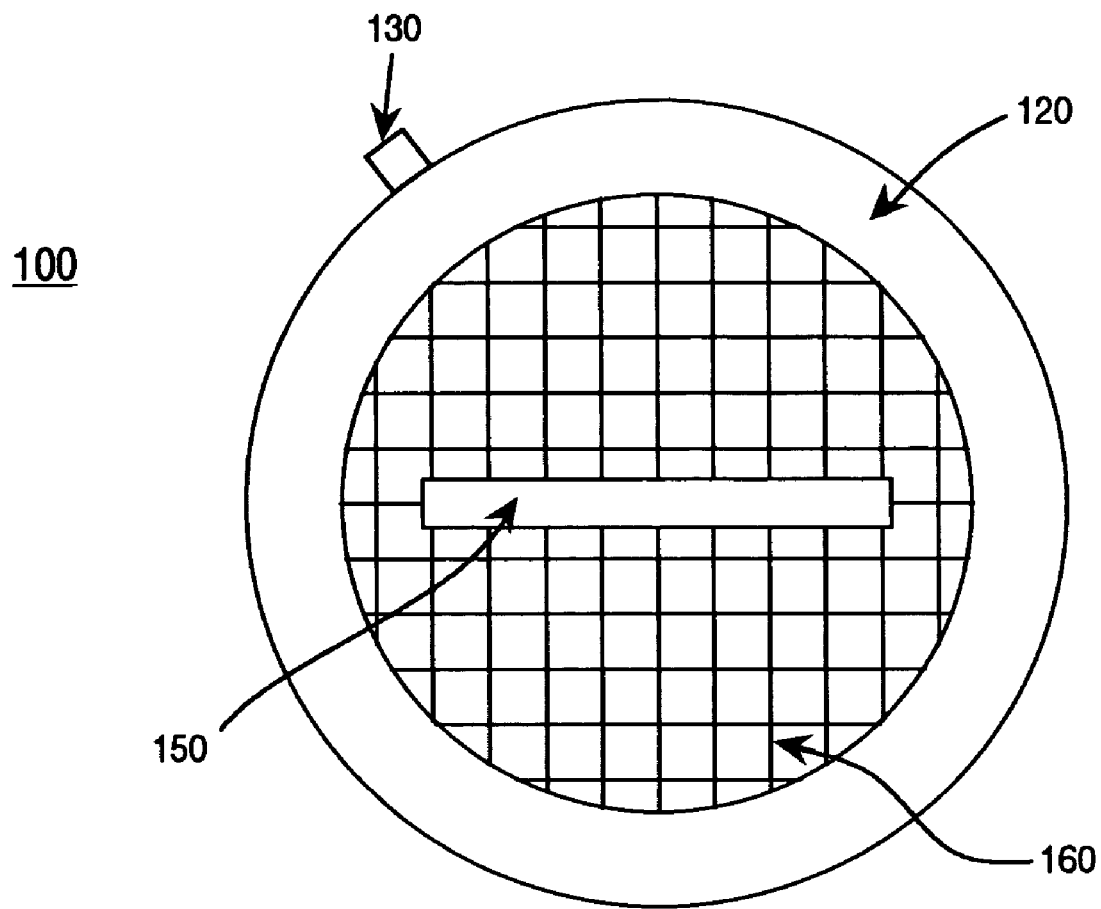
FIG. 2 depicts a mesh guard on a removable fan assembly which prevents the operator from accidentally touching any rotating parts while the fan is in operation.

FIG. 2 illustrate front side of a fan assembly 100 equipped with a mesh guard 160 and turn tab 150, in accordance with an embodiment of the present invention. The mesh guard 160 as depicted in FIG. 2 helps to prevent objects from entering or exiting the electric device (e.g. a personal computer) via the fan assembly. The mesh guard 160 also prevents the operator from accidentally touching any rotating parts (e.g. fan blades 110) while the unit is in operation. The turn tab 150 illustrated in FIG. 2 allows a user to intuitively install the fan assembly 100 into a receiving assembly and turn the fan assembly 100 to engage a bayonet lock, as described below.

Figure 3A:
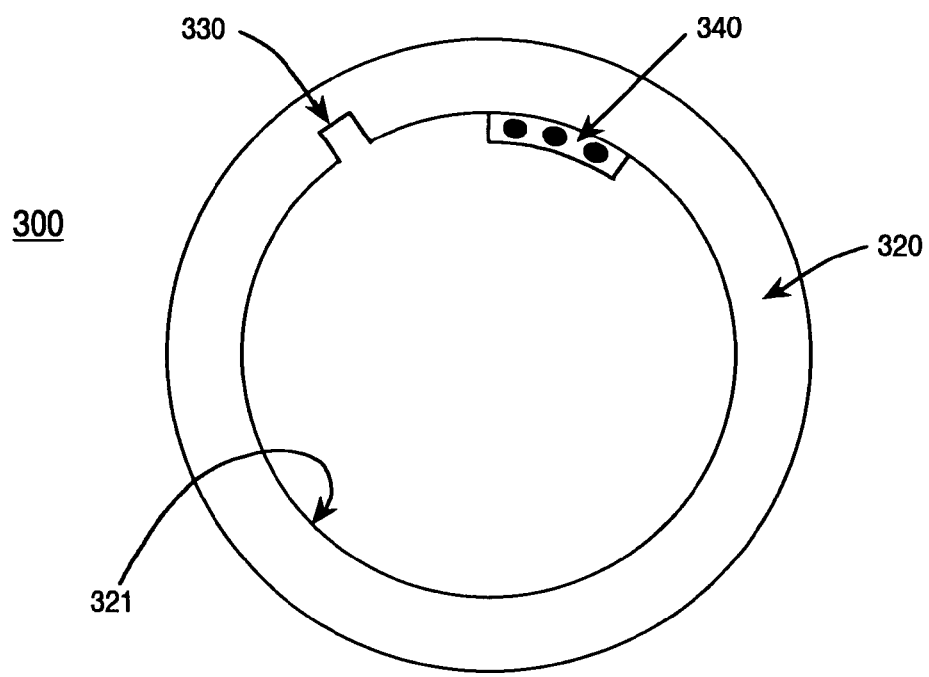
FIG. 3A is a view of a receiving assembly for a cooling system for an electric device.

FIG. 3A depicts a receiving assembly 300, or receiving tube for a cooling system for an electric device in accordance with an embodiment of the present invention. The receiving assembly can be any type or shape as long as the inner contour 321 is cylindrical and can accommodate the cylindrical fan. A cylindrical frame 320 has a groove 330 for a bayonet lock and an electrical contact 340.

Figure 3B:
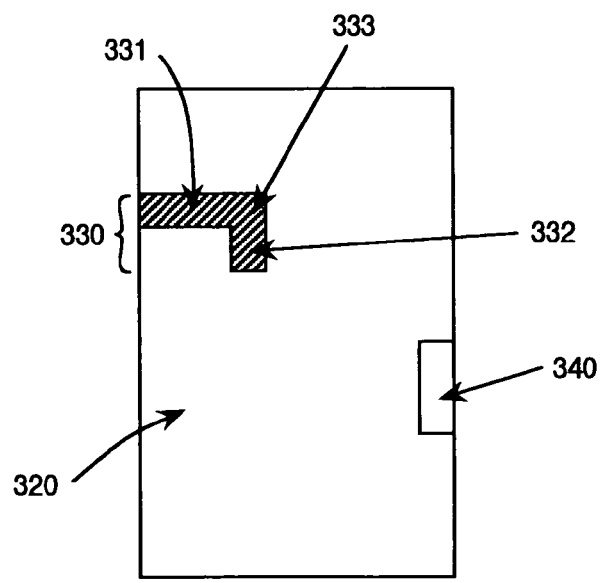
FIG. 3B is a side view of a receiving assembly for a cooling system for an electric device.

FIG. 3B depicts a side view of the receiving assembly 300. FIG. 3B illustrates the bayonet lock groove 330 in detail. In accordance with an embodiment of the present invention, the bayonet groove 330 is of appropriate dimension for receiving the bayonet key 130 on the fan assembly 100. The bayonet groove has a first leg 331 that runs from in the front-to-back direction along the inner surface 321 of the cylindrical frame 320 of the receiving assembly 300. A second leg 332 of the bayonet groove 330 is perpendicular to the first leg 331. The first leg 331 and the second leg 332 of the bayonet groove 330 meet at a junction 333. The electrical contact 340 is situated along the interior surface of the cylindrical frame 320 of the receiving assembly 300 to facilitate an electrical connection with the electrical contact 140 on the fan assembly 100.

Figure 3C:
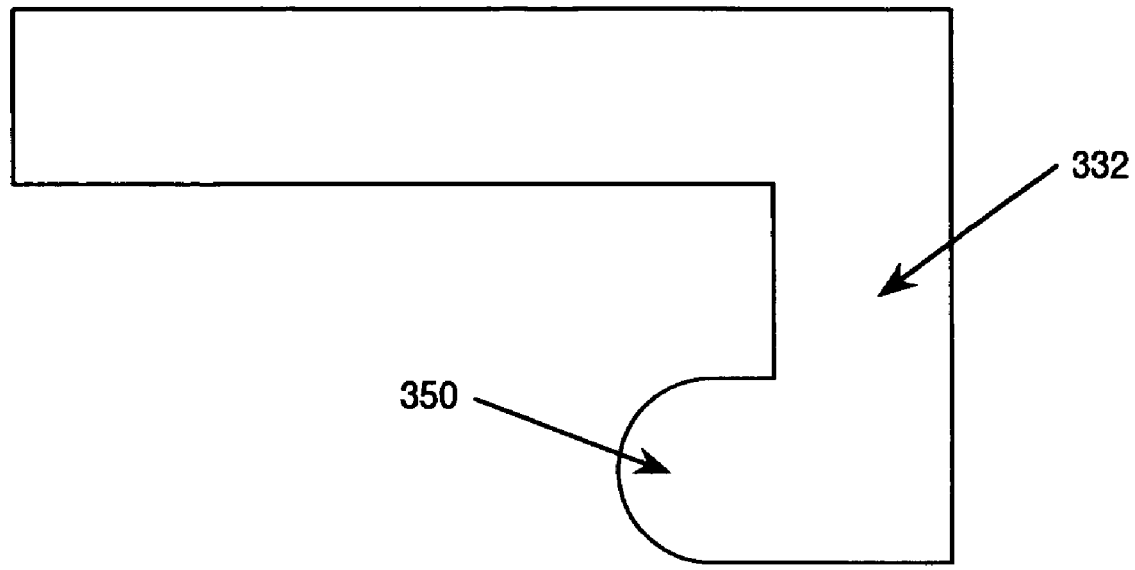
FIG. 3C is a close-up view of a bayonet groove in accordance with embodiments of the present invention.

FIG. 3C depicts a detailed view of the bayonet groove 330. Inserting the bayonet key 130 into the first leg 331 of the bayonet groove positions the fan assembly so that the bayonet groove 330 and bayonet key 130 line up properly. The bayonet groove 330 insures alignment while the fan assembly 100 is inserted and push into receiving assembly 300. Once fan assembly is fully inserted into receiving assembly 300, and the bayonet key 130 has reached the junction 333 of the first leg 331 and the second leg 332 of the bayonet groove 330, allow for twist motion to align electrical contact 140. In one embodiment, electrical contact 140 is integral with the bayonet key 130, as depicted in FIG. 1D. This bayonet key/electrical contact 131 is spring loaded with a spring 145. In this embodiment, once the electrical contacts 140 are properly aligned, the spring 145 of the bayonet key forces the fan forward and locks the fan assembly in place.

FIG. 3C illustrates a bayonet groove according to an alternative embodiment of the present invention. As depicted in FIG. 3C, a bulbous pocket 350 is located at the end of the second leg 332 of the bayonet groove 330. In a preferred embodiment, upon proper alignment of the electrical contacts 140, the spring 145 on the bayonet key 131 forces the bayonet key 131 into the bulb 350, thereby locking the bayonet key 131 and the fan assembly 100 in place.

Another embodiment of the present invention is a cooling system having a fan assembly with a bayonet groove as described above and depicted in the figures, and a receiving assembly having a bayonet key. Other embodiments employ other locking mechanisms.

Figure 4:
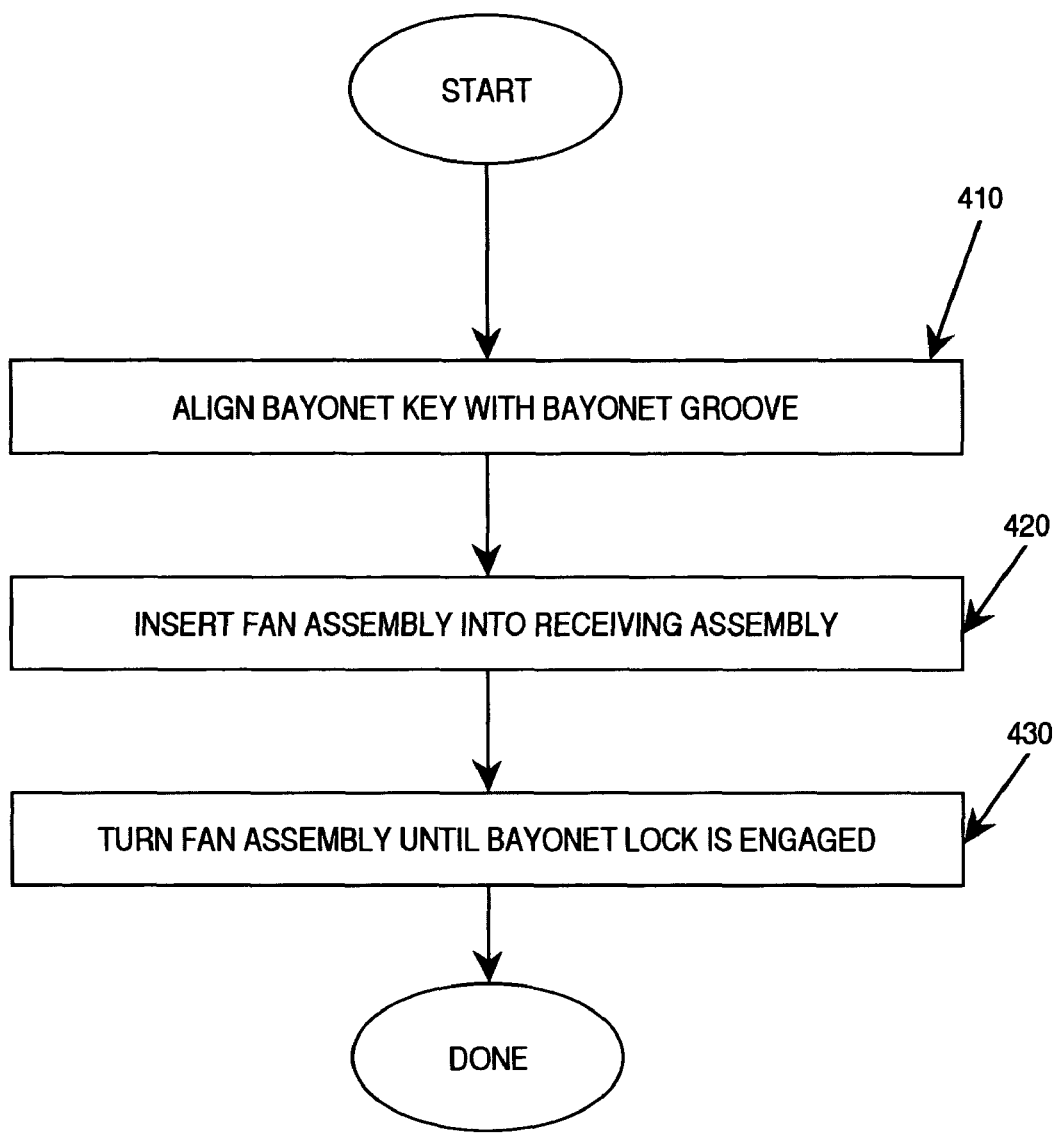
FIG. 4 is a flowchart representing a method of installing a fan assembly into a receiving assembly according to an embodiment of the invention.

FIG. 4 is a flowchart 400 illustrating steps in a method of installing a fan assembly into a receiving assembly, according to an embodiment of the present invention. Initially, as step 410 recites, the fan assembly must be aligned with the receiving assembly. In one embodiment, the receiving assembly is part of or is connected with a chassis for a personal computer. In another embodiment, the receiving assembly is connected with or is part of a chassis for a hair dryer. In one embodiment, the receiving assembly has a bayonet lock groove and the fan assembly has a bayonet lock key. In another embodiment, the receiving assembly has a bayonet lock key and the fan assembly has a matching bayonet lock groove. As illustrated in FIG. 4, step 410, the bayonet key is aligned with the bayonet groove. Then, as in step 420, the fan assembly is inserted into the receiving assembly, and in doing so, the bayonet key slides into the first leg of the bayonet groove. In another embodiment, the fan assembly and receiving assembly may be constructed such that the cylindrical housing of the fan assembly fits over the cylindrical housing of the receiving assembly, and the components of the bayonet lock are on an exterior surface of the receiving assembly and an interior surface of the fan assembly.

Flowchart 400 continues with turning the fan assembly to engage the bayonet lock, as recited in step 430. Once the fan assembly is inserted into the receiving assembly (or vice versa), the bayonet key has reached the junction in the bayonet groove. At this point, the fan assembly can be turned in the direction of the second leg of the bayonet groove. Once the fan assembly is turned until the bayonet key reaches the end of the second leg of the bayonet groove, the bayonet lock is engaged. Once the bayonet lock is engaged, the fan assembly is not likely to be inadvertently removed from the receiving assembly.

According to one embodiment of the present invention, the fan assembly cannot operate (e.g. the fan cannot turn) without electric power. When the fan assembly is first inserted into the receiving assembly, there is no electrical connection for the fan. However, the electrical contact on the fan assembly is situated with radial respect to the electrical contact on the receiving assembly such that turning the fan assembly to engage the bayonet lock forces an electrical connection between the contacts. According to one embodiment, power from a power source is connected with the electrical contact on the receiving assembly. Once the two or more electrical contacts are connected, power can be supplied to spin the fan blade in the fan assembly. In other embodiments, there are more than one electrical contacts on the fan assembly and more than one electrical contacts on the receiving assembly. In a preferred embodiment, while locking the removable fan assembly in place (twisting motion), the first electrical contact is positioned so that a "ground" contact would be made first, and power second. This ensures that the fan assembly is "hot-swappable," in other words the fan can be inserted or removed without damaging the device or exposing the user to danger.

Figure 5A:
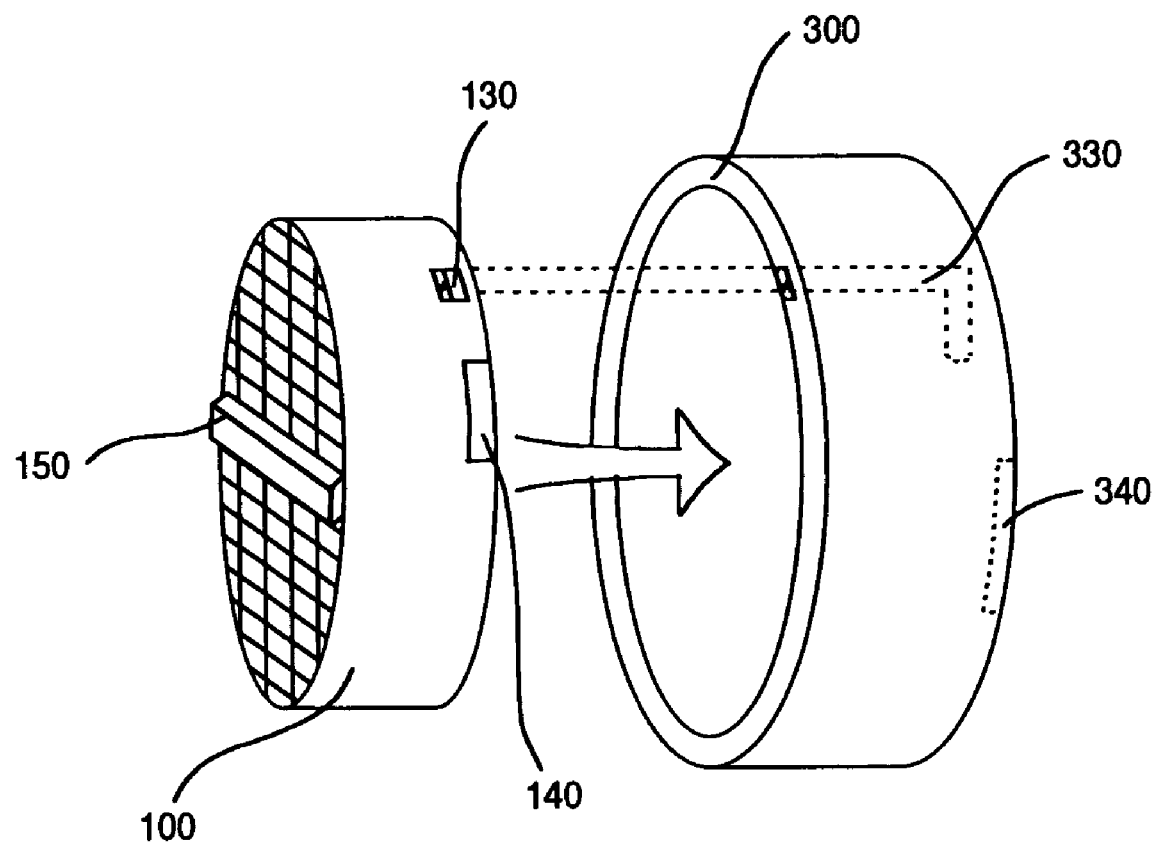
FIG. 5 is an illustration of a method for installing a fan assembly into a receiving assembly on an electric device.
Figure 5B:
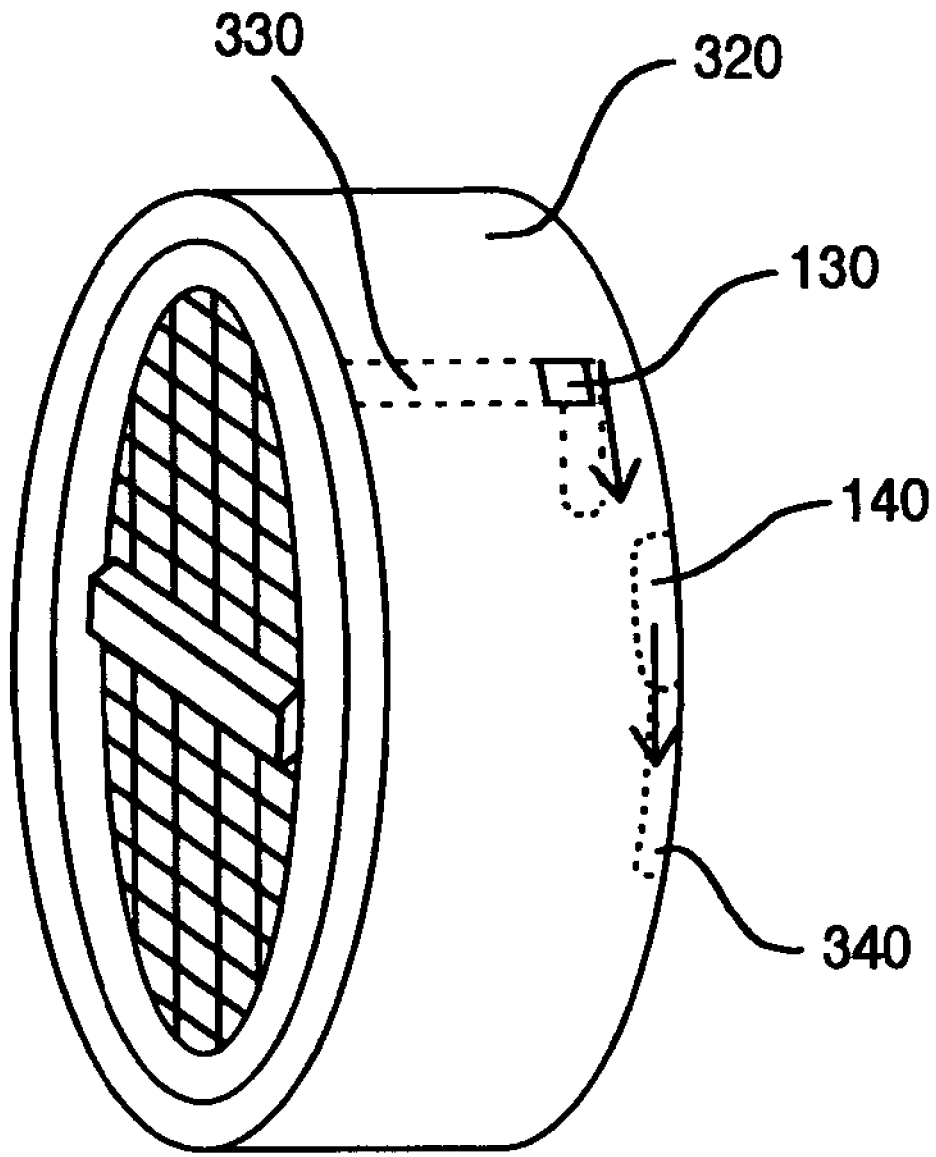
Figure 5C:
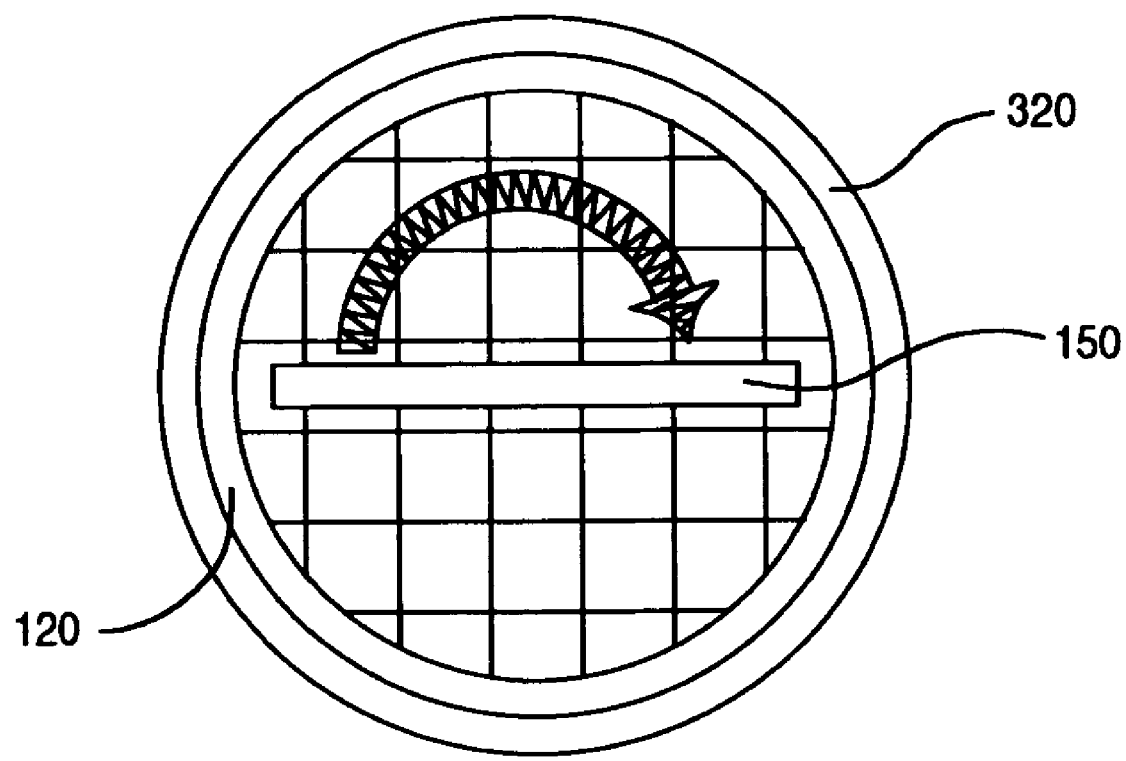

FIGS. 5A-5C illustrate the method described in flowchart 400. First, as shown in FIG. 5A, the fan assembly 100 is aligned with the receiving assembly 300 such that the bayonet key 130 is aligned with the first leg of the bayonet groove 330. Then, as shown in FIG. 5B, the fan assembly is inserted into the receiving assembly. Once the bayonet key has reached the junction in the bayonet groove 330, the fan assembly is turned to engage the bayonet lock and connect the electrical contacts, as shown in FIG. 5C. The legs and junction of the bayonet groove are illustrated in FIG. 3B. In one embodiment, the fan assembly is turned using the turn tab 150 in a clockwise direction to engage the bayonet lock.

Figure 6:
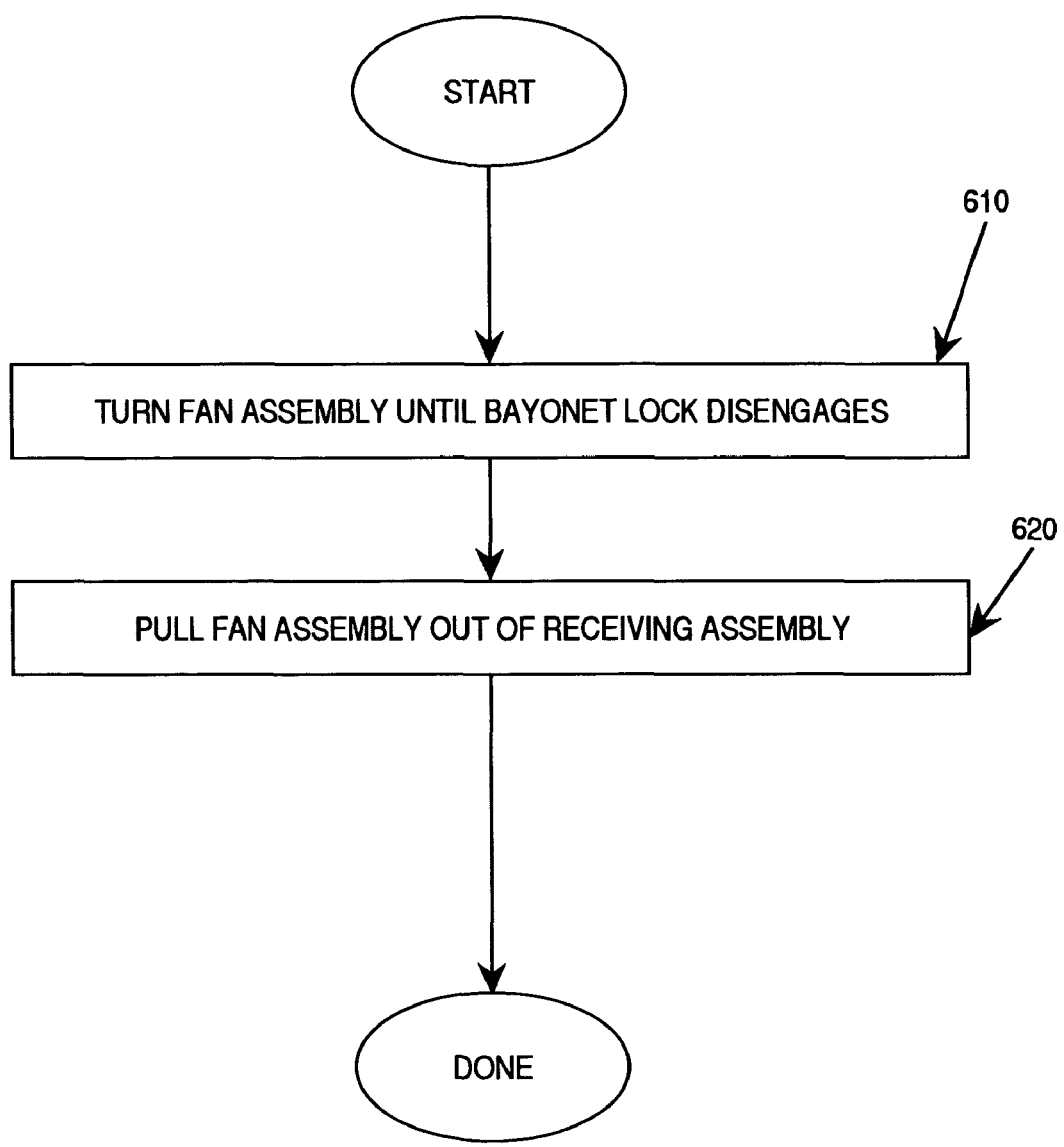
FIG. 6 is a flowchart representing a method of removing a fan assembly from a receiving assembly according to an embodiment of the invention.

FIG. 6 is a flowchart 600 describing a method for removing the fan assembly from the receiving assembly in a cooling system for an electric device in accordance with the present invention. Initially, as recited in step 610, the fan assembly must be turned in a direction such that the bayonet key leaves the end of the second leg of the bayonet groove and travels to the junction of the bayonet groove. Turning the fan assembly in this fashion disengages the bayonet lock. Once the bayonet lock is disengaged, the fan assembly can be pulled out of the receiving assembly, as recited in step 620. Once the bayonet lock is disengaged, the electrical connection is also disengaged.

Alternative embodiments of the present invention include reversing the positions of the bayonet key and the bayonet groove, such that the groove is on the fan assembly and the key is on the receiving assembly. The present invention is not limited to bayonet locks, but includes any mechanical lock that permits a user to intuitively, easily and repeatedly engage the fan assembly with the receiving assembly as needed.

Figure 7A:
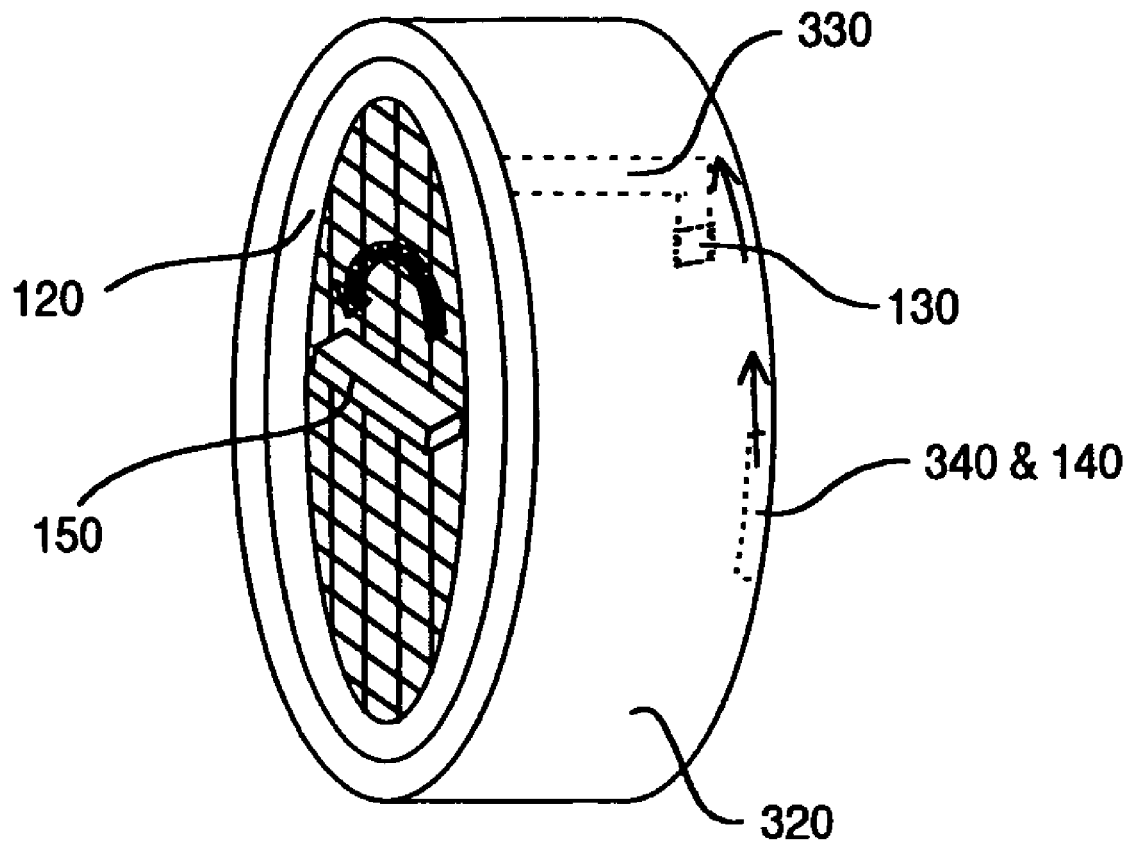
FIG. 7 is an illustration of a method for removing a fan assembly from a receiving assembly on an electric device.
Figure 7B:
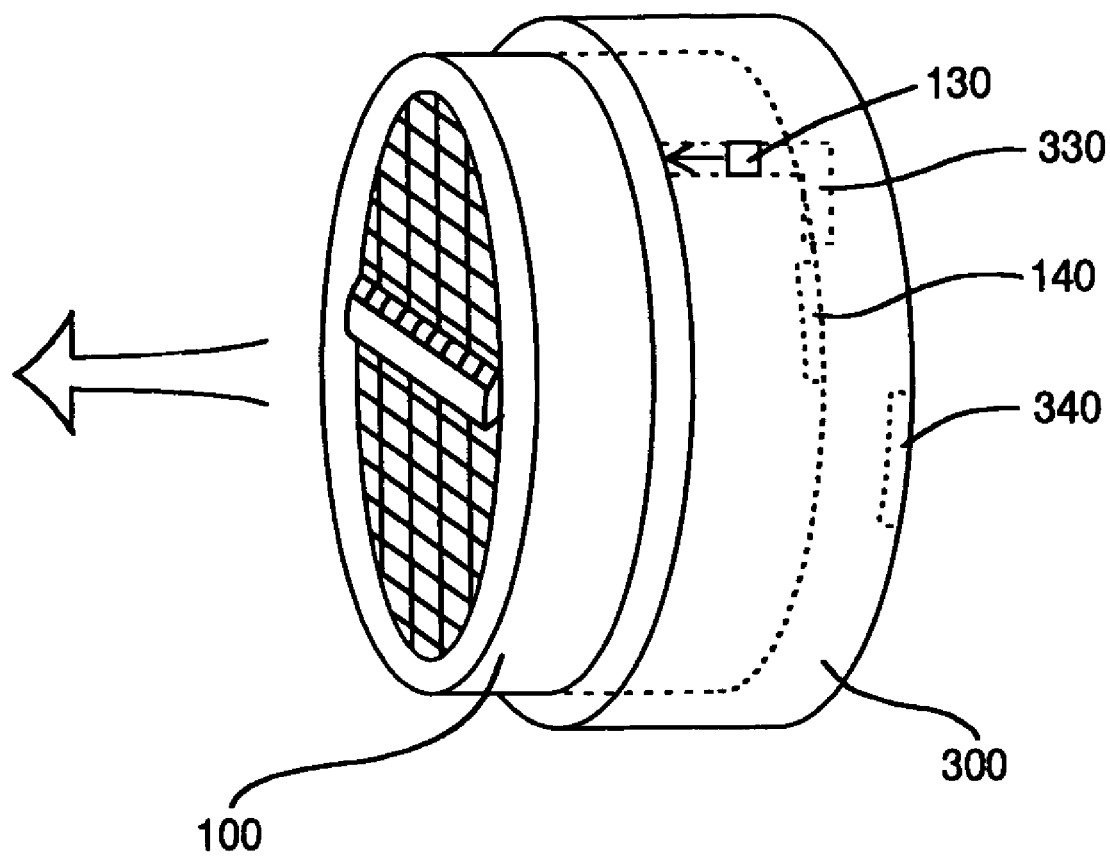

FIGS. 7A and 7B illustrate the method described in flowchart 600 in FIG. 6. The fan assembly 120 is turned in a direction to disengage the bayonet lock, e.g. to move the bayonet key 130 away from the end of the second leg of the bayonet groove 330 and toward the junction of the groove 330. The legs and junction of the bayonet groove are illustrated in FIG. 3B. Turning the fan assembly in this way disengages the bayonet lock as well as the electrical connection between the electrical contact 140 on the fan assembly and the electrical contact 340 on the receiving assembly. In one embodiment, a user grasping the turn tab 150 as depicted in FIG. 2 can turn the fan assembly. In one embodiment, the fan assembly is turned in a counterclockwise direction to disengage the bayonet lock. Once the bayonet lock has been disengaged by turning the fan assembly, the fan assembly 100 can be pulled out of the receiving assembly 300, according to an embodiment of the present invention, and depicted in FIG. 7B.

It can be appreciated that the fan assembly and the receiving assembly of the present invention can be constructed from any material (e.g. plastic, metal) that is appropriate for a cooling system for an electric device. Embodiments of the present invention permit repeated installation and removal of fan assembly to and from the receiving assembly without deterioration of the locking mechanism used to keep the front panel in place. The fan assembly of the present invention is not likely to be inadvertently knocked out of the receiving assembly. Installation and removal of the fan assembly requires only a single user. Both installation and removal are intuitive procedures. Embodiments of the present invention provide easy installation and quick release of the fan assembly while maintaining adequate structural strength of both the mechanical connection and the electrical connection between the fan assembly and the receiving assembly.

The foregoing description of specific embodiments of the present invention have been presented for purposes of illustration and description. They are not intended to be exhaustive or to limit the invention to the precise forms disclosed, and many modifications and variations are possible in light of the above teaching. The embodiments of were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electrical device cooling system, said cooling system comprising:
  a receiving assembly formed with an electrical device, comprising:
    a first component of a bayonet lock; and
    a first electrical contact formed with an inner wall of the receiving assembly; and
  a removable fan assembly comprising:
    a frame;
    a fan blade;
    a motor for said fan blade, wherein the fan blade and motor are located within the frame;
    a second component of said bayonet lock wherein one of said first and second components of the bayonet lock is a bayonet key and the other one of said first and second components of the bayonet lock is a bayonet groove, and wherein the one of the first and second components of the bayonet lock is located within an outer surface of the frame and the bayonet key comprises a perpendicular protrusion and a loaded spring coiled thereupon for locking said bayonet key into said bayonet groove, said bayonet groove being formed in the inner wall of the receiving assembly to receive the perpendicular protrusion from an inside of the receiving assembly and comprising:
      a first leg;
      a second leg generally perpendicular to the first leg; and
    a second electrical contact, wherein said first and second electrical contacts are situated with radial respect to each other such that no electrical connection is formed between said first and second electrical contacts until said bayonet lock is engaged and forces an electrical connection between said first and second electrical contacts.

2. The cooling system of claim 1 wherein said receiving assembly comprises a first interior cylindrical shape having the bayonet groove formed therein, and said fan assembly comprises a second cylindrical shape having the bayonet key located on the outer surface thereof, wherein said second cylindrical shape fits within said first cylindrical shape.

3. The cooling system of claim 1 wherein said fan assembly is controlled and powered by the electrical device via said connection between said first and second electrical contacts.

4. The cooling system of claim 1 wherein said fan assembly further comprises an external tab located in front of the fan blade and operable with a single thumb and a single finger for turning, installing, removing, and handling said fan assembly.

5. The cooling system of claim 1 wherein said fan assembly further comprises a static external mesh guard for preventing objects from entering or exiting the electrical device.

6. The cooling system of claim 1 wherein said electrical device is a personal computer.

7. The cooling system of claim 1, wherein one of said first and second electrical contacts is integral with an end of said bayonet key.

8. The cooling system of claim 1 wherein disengaging said bayonet lock forces an electrical disconnection between said first and second electrical contacts.

9. The cooling system of claim 1, wherein the first electrical contact is located in the second leg.

10. The cooling system of claim 1, wherein the first electrical contact is located inside the bayonet groove.

11. The cooling system of claim 1, wherein the second electrical contact is located on a distal end of the perpendicular protrusion from the removable fan assembly.

12. The cooling system of claim 1, wherein:
  the first electrical contact comprises a plurality of first electrical contacts;
  the second electrical contact comprises a plurality of second electrical contacts situated with radial respect to the plurality of first electrical contacts;
  the electrical connection comprises a ground connection and a power connection; and
  at least one of the first electrical contacts and at least one of the second electrical contacts are positioned such that the ground connection is made before the power connection when the bayonet lock is engaged and the ground connection is made after the power connection when the bayonet lock is disengaged.

13. A removable fan for a cooling system for an electric device, wherein said cooling system comprises a receiving assembly comprising:
 a first cylindrical shape formed with the electrical device;
 a first component of a bayonet lock; and
 a first electrical contact formed with an inner wall of the first cylindrical shape, wherein said fan comprises:
  a second cylindrical shape, wherein said second cylindrical shape fits within said first cylindrical shape;
  a frame;
  a fan blade;
  a motor for said fan blade, wherein the fan blade and motor are located within the frame;
 a second component of said bayonet lock wherein one of said first and second components of the bayonet lock is a bayonet key and the other one of said first and second components of the bayonet lock is a bayonet groove, and wherein the one of the first and second components of the bayonet lock is located within an outer surface of the frame and the bayonet key comprises a perpendicular protrusion and a loaded spring coiled thereupon for locking said bayonet key into said bayonet groove, said bayonet groove being formed in the inner wall of the first cylindrical shape to receive the perpendicular protrusion from an inside of the first cylindrical shape and comprising:
  a first leg;
  a second leg generally perpendicular to the first leg; and
 a second electrical contact, and wherein said second electrical contact is situated with radial respect to said first electrical contact such that no electrical connection is formed between said first and second electrical contacts until said bayonet lock is engaged and forces an electrical connection between said first and second electrical contacts.

14. The fan of claim 13 further comprising an external tab located in front of the fan blades and operable with a single thumb and a single finger for turning, installing, removing, and handling said fan.

15. The fan of claim 13 further comprising a static mesh guard on an exterior surface of said fan said static mesh guard configured to prevent objects from entering or exiting the electrical device.

16. The fan of claim 13 wherein said electric device is a personal computer.

17. A method for removably coupling a fan assembly with an electric device, wherein said electric device comprises a receiving assembly for receiving said fan assembly, wherein said fan assembly comprises a first component of a bayonet lock, a first electrical contact formed with an inner wall of the receiving assembly, and a frame, wherein a plurality of fan blades and a motor are located within the frame, and wherein said receiving assembly comprises a second component of said bayonet lock and a second electrical contact, and wherein the one of the first and second components of the bayonet lock is located within an outer surface of the frame, said method comprising:
 aligning said first and second components of said bayonet lock wherein one of said first and second components of the bayonet lock is a bayonet key and the other one of said first and second components of the bayonet lock is a bayonet groove and the bayonet key comprises a perpendicular protrusion and a loaded spring coiled thereupon for locking said bayonet key into said bayonet groove, said bayonet groove being formed in the inner wall of the receiving assembly to receive the perpendicular protrusion from an inside of the receiving assembly and comprising:
  a first leg;
  a second leg generally perpendicular to the first leg; and
 inserting said fan assembly into said receiving assembly, including inserting the bayonet key into the bayonet groove along a first direction;
 turning said fan assembly in a second direction perpendicular to the first direction until said bayonet lock engages, wherein said first and second electrical contacts are situated with radial respect to each other such that said turning said fan assembly no electrical connection is formed between said first and second electrical contacts until said bayonet lock is engaged and forces an electrical connection between said first and second electrical contacts.

18. The method of claim 17 wherein said fan assembly comprises a first cylindrical shape, said receiving assembly comprises a second cylindrical shape which can accommodate said first cylindrical shape.

* * * * *